United States Patent
Zuffada et al.

(10) Patent No.: US 9,099,965 B2
(45) Date of Patent: Aug. 4, 2015

(54) INTEGRATED DRIVER AND RELATED METHOD

(75) Inventors: Maurizio Zuffada, Milan (IT); Massimo Pozzoni, Pavia (IT); Angelo Contini, Lomello (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 178 days.

(21) Appl. No.: 13/989,488

(22) PCT Filed: Dec. 1, 2011

(86) PCT No.: PCT/EP2011/071480
§ 371 (c)(1),
(2), (4) Date: Aug. 12, 2013

(87) PCT Pub. No.: WO2012/072726
PCT Pub. Date: Jun. 7, 2012

(65) Prior Publication Data
US 2013/0308893 A1  Nov. 21, 2013

(30) Foreign Application Priority Data
Dec. 1, 2010  (IT) .............................. VA2010A0091

(51) Int. Cl.
*G02B 6/00*  (2006.01)
*G02F 1/01*  (2006.01)
(Continued)

(52) U.S. Cl.
CPC ............ *H03F 3/2171* (2013.01); *G02F 1/0121* (2013.01); *G02F 1/0327* (2013.01);
(Continued)

(58) Field of Classification Search
CPC ................. G02B 6/00; G02F 1/01; H03F 1/22

USPC .......................................... 385/3, 14; 330/251
See application file for complete search history.

(56) References Cited

U.S. PATENT DOCUMENTS 4,307,342 A * 12/1981 Peterson ........................ 324/537
5,055,836 A * 10/1991 Kane .............................. 340/2.2
(Continued)

FOREIGN PATENT DOCUMENTS

EP  2184853 A2 *  5/2010  ............. H03K 3/356

OTHER PUBLICATIONS

Serneels et al., "A High Speed, Low Voltage to High Voltage Level Shifter in Standard 1.2V 0.13um CMOS," IEEE, Dec. 1, 2006, pp. 668-671.
(Continued)

*Primary Examiner* — Kaveh Kianni
(74) *Attorney, Agent, or Firm* — Allen, Dyer, Doppelt, Milbrath & Gilchrist, P.A.

(57) ABSTRACT

A driver circuit may include a first node (VA), and a first circuit to generate on the first node (VA) an inverted replica of an input signal (VIN) during driver switching between a first supply voltage (Vdd1) and ground, the inverted replica having a threshold voltage value based upon a reference voltage (Vref) greater than the first supply voltage (Vdd1). The driver circuit may include a cascode stage (M3) to be controlled by the reference voltage (Vref) and to be coupled between a second supply voltage (Vdd2) and the first node, a delay circuit (D) to generate a delayed replica of the input signal (VIN), an amplifier, and a switching network (M5, M6) to couple a control terminal of an active load transistor (M9) either to one of the reference voltage (Vref) or to ground, based upon the input signal (VIN).

19 Claims, 5 Drawing Sheets

(51) Int. Cl.
| | |
|---|---|
| *H03F 1/22* | (2006.01) |
| *H03F 3/217* | (2006.01) |
| *H03F 3/24* | (2006.01) |
| *H03F 3/30* | (2006.01) |
| *H03F 3/45* | (2006.01) |
| *H03K 19/0185* | (2006.01) |
| *H04B 10/532* | (2013.01) |
| *H04B 10/61* | (2013.01) |
| *G02F 1/03* | (2006.01) |
| *G02F 1/225* | (2006.01) |

(52) U.S. Cl.
CPC ................ *G02F 1/225* (2013.01); *H03F 1/22* (2013.01); *H03F 1/223* (2013.01); *H03F 3/245* (2013.01); *H03F 3/3001* (2013.01); *H03F 3/45076* (2013.01); *H03F 3/45179* (2013.01); *H03K 19/018528* (2013.01); *H04B 10/532* (2013.01); *H04B 10/616* (2013.01); *H03F 2200/45* (2013.01); *H03F 2200/516* (2013.01); *H03F 2203/30099* (2013.01); *H03F 2203/30132* (2013.01)

(56) References Cited

U.S. PATENT DOCUMENTS

| | | | |
|---|---|---|---|
| 6,313,676 B1* | 11/2001 | Abe et al. | 327/158 |
| 6,462,998 B1* | 10/2002 | Proebsting | 365/205 |
| 6,714,043 B1* | 3/2004 | Sharpe-Geisler | 326/39 |
| 6,720,755 B1* | 4/2004 | Sharpe-Geisler | 323/314 |
| 6,760,209 B1* | 7/2004 | Sharpe-Geisler | 361/111 |
| 6,798,244 B1* | 9/2004 | Sharpe-Geisler | 326/81 |
| 6,870,391 B1* | 3/2005 | Sharpe-Geisler | 326/37 |
| 6,949,906 B2* | 9/2005 | Boscolo et al. | 318/599 |
| 7,199,617 B1 | 4/2007 | Schrom et al. | |
| 7,450,787 B2 | 11/2008 | Kucharski et al. | |
| 7,519,301 B2 | 4/2009 | Keil et al. | |
| 2003/0146791 A1* | 8/2003 | Shvarts et al. | 330/297 |
| 2008/0100342 A1 | 5/2008 | Muhlbacher et al. | |
| 2009/0148094 A1 | 6/2009 | Kucharski et al. | |
| 2010/0214032 A1* | 8/2010 | Hinrichs | 331/57 |
| 2010/0277152 A1* | 11/2010 | MacFarlane | 323/288 |

OTHER PUBLICATIONS

Lee et al., "P-13: Low-Power a-Si Level Shifter for Mobile Displays with Bootstrapped Capacitor and Pulsed Signal Source," Society for Information Display, Los Angeles, CA, May 20, 2007, pp. 218-221.

\* cited by examiner

FIG. 7

INTEGRATED DRIVER AND RELATED METHOD

FIELD OF THE INVENTION

The present disclosure relates to drivers for capacitive loads and, more particularly, to single-ended or differential integrated architectures of drivers including voltage transistors.

BACKGROUND OF THE INVENTION

Figure 1:
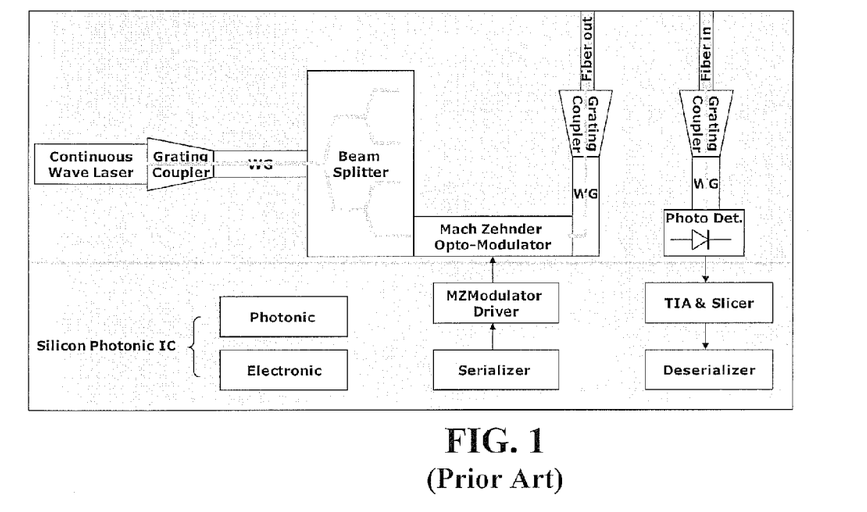
FIG. 1 is a basic high-level block diagram of an integrated optical transmitter and receiver, according to the prior art.

In the emerging technology known as "Silicon Photonics," optical devices are integrated with electronic components. A classical "Silicon Photonics" application includes an optical transmitter and an optical receiver and is shown in FIG. 1. A high frequency data stream is transmitted by modulating a laser beam. By way of this beam modulation, an electrical data stream is converted into an optical data stream, which is more suitable for a long-distance low-loss data transmission.

Together with optical modulators, optical switches are commonly integrated with electrical functional circuits in a "Silicon Photonic" integrated circuit. Driving these optical modulators commonly may require both high voltage and high speed capabilities, with the constraint of driving large capacitive loads with very short rise and fall time constants.

Figure 2:
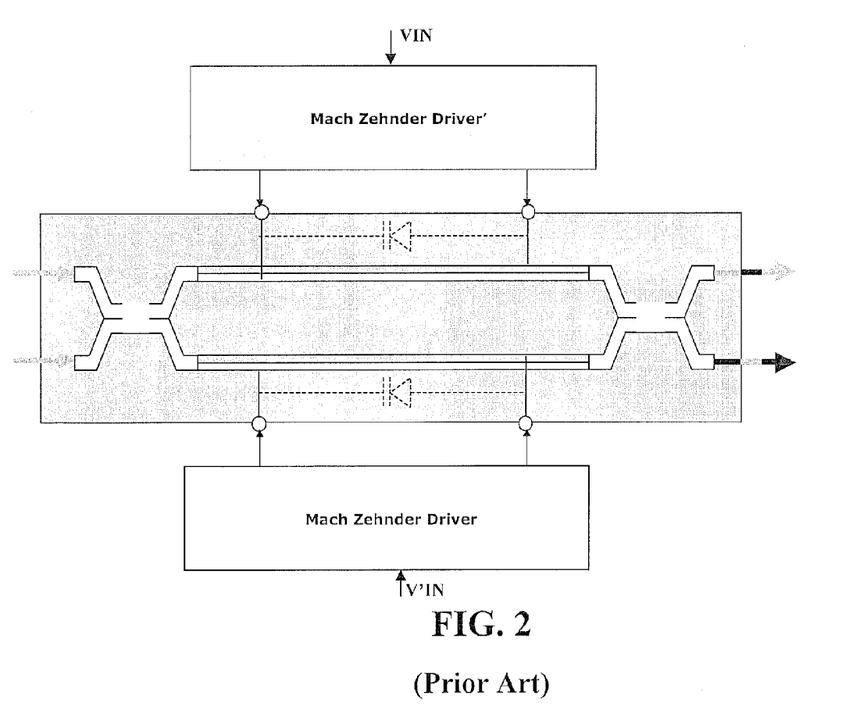
FIG. 2 illustrates two single-ended drivers for a Mach Zehnder optoelectronic modulator, according to the prior art.

An example of these functional circuits is the driver for the Mach Zehnder optoelectronic modulator of FIG. 2. An integrated Mach Zehnder (MZ) optoelectronic modulator is a combination of two directional couplers interconnected by two symmetrical silicon waveguides of a given length. The group velocity of the light into the two waveguides is controlled by the voltage polarization of two varicap diodes. The working principle of the MZ optoelectronic modulator is based on the constructive or destructive interference of the two separated paths as a consequence of the two different light group velocities.

In an MZ optoelectronic modulator, such a selective interference is used to modulate a continuous wave laser beam, but the same principle of constructive or destructive interference is commonly used also to perform other optical functions, like optical switches variable attenuators etc.

The driver is commonly required to have high current capability at high power efficiency. If $C_L$ is the value of the capacitance of the MZ optoelectronic modulator, the required capability of the output driver may be approximated as follows:

$$I_{out} = \frac{C_L \cdot V_{out\_peak}}{tr(\text{or } tf)},$$

wherein tr and tf are the rise time and the fall time constants, respectively.

Figure 3:
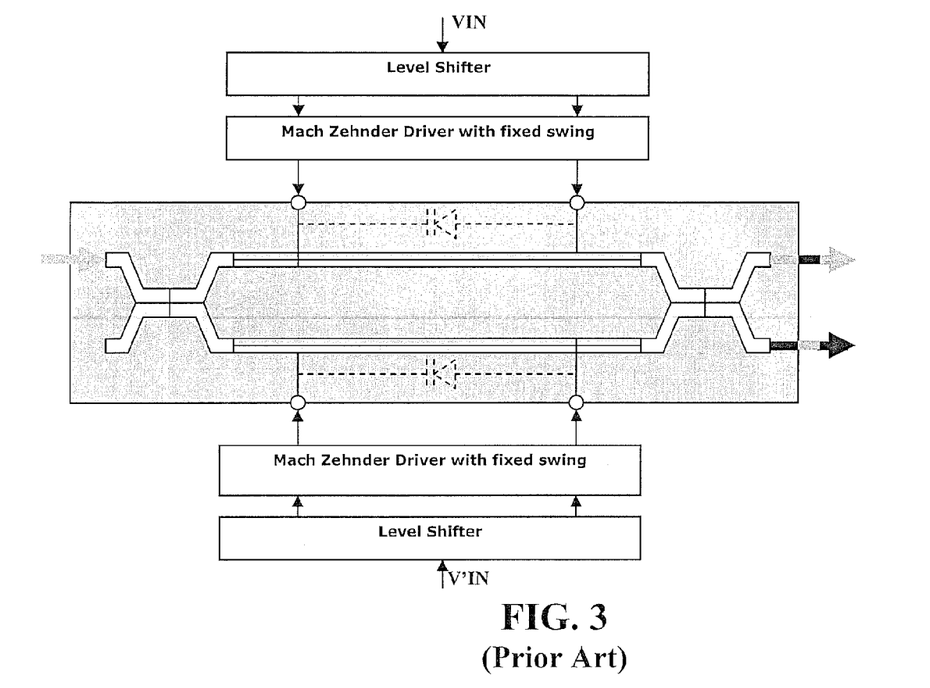
FIG. 3 illustrates two single-ended drivers for a Mach Zehnder optoelectronic modulator with a fixed swing voltage, each having an input level shifter for increasing the voltage level of the differential input signal $V_{IN}$-$V'_{IN}$, according to the prior art.

FIG. 3 shows a typical application. Due to high speed requirements, high-speed complementary metal-oxide-semiconductor (CMOS) technologies are commonly selected for the electronic part. These may include the draw-back of the voltage capability of the CMOS not being adequate for the voltage levels required for driving the MZ. For this reason, the driver is commonly required to drive the MZ optoelectronic modulator with a voltage swing exceeding the low voltage CMOS supply ($V_{dd1}$).

Prior art approaches may include high voltage level shifters to convert the CMOS digital input signals, that are constrained within a low voltage supply (Vdd1), to the output buffer voltage levels (Vout) required to drive the Mach Zehnder optoelectronic modulators, as schematically shown in FIG. 3. Moreover, prior art approaches may also have a fixed output swing without any possibility of adjusting the peak value of the output voltage Vout. U.S. Patent Application Publication No. 2009/0148094 to Kucharski et al. and U.S. Pat. No. 7,450,787 to Kucharski et al. disclose an optoelectronic device having a plurality of optical modulators and a plurality of distributed amplifiers, each electrically coupled to a respective optical modulator. U.S. Pat. No. 7,519,301 to Keil et al. discloses several circuit architectures of emitter follower-based or source follower-based drivers coupled to drive a Mach-Zehnder interferometer optical modulator. U.S. Pat. No. 7,199,617 discloses a level shifting device that can translate an input signal operating in a first voltage range to an output signal operating in other voltage ranges while using transistors rated to withstand the supply voltage.

SUMMARY OF THE INVENTION

The MZ optoelectronic modulator is indicated as an exemplary field of application of the applicant's disclosure, though the disclosed architectures may be used also for driving in general any kind of load, in particular other capacitive loads and not exclusively MZ optoelectronic modulators.

A flexible and cost efficient driver architecture may be adapted to drive capacitive loads, such as, for example, a Mach Zehnder optoelectronic modulator.

The driver architecture may comprise low-voltage transistors and may generate a high output driving voltage with a large swing without requiring a high-voltage level shifter. Single-ended and differential architectures of an integrated CMOS driver architecture, particularly suited to drive a substantially capacitive load, such as, for example, a Mach Zehnder optoelectronic modulator, are disclosed.

DETAILED DESCRIPTION OF THE PREFERRED EMBODIMENTS

Fully integrated single-ended and differential CMOS driver architectures suitable for realizing high speed driving stages of different types of loads, in particular, of a Mach Zehnder optoelectronic modulator or of distributed fully differential Mach Zehnder optoelectronic modulators, which show a dominant capacitive load impedance, are shown.

Figure 4:
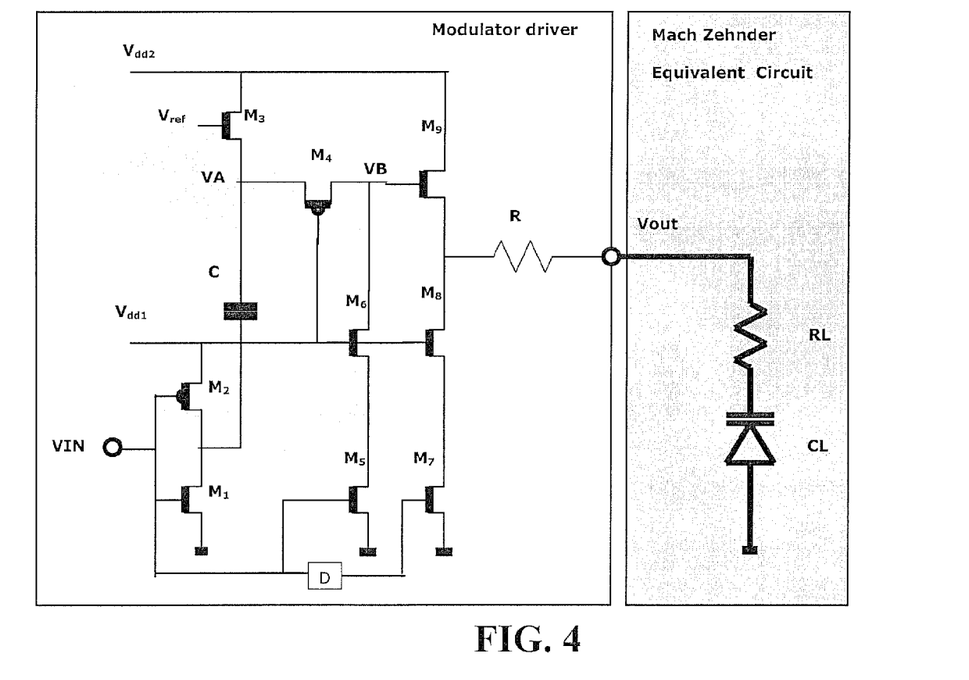
FIG. 4 is an embodiment of a single-ended CMOS driver architecture, according to the present invention.
Figure 5:
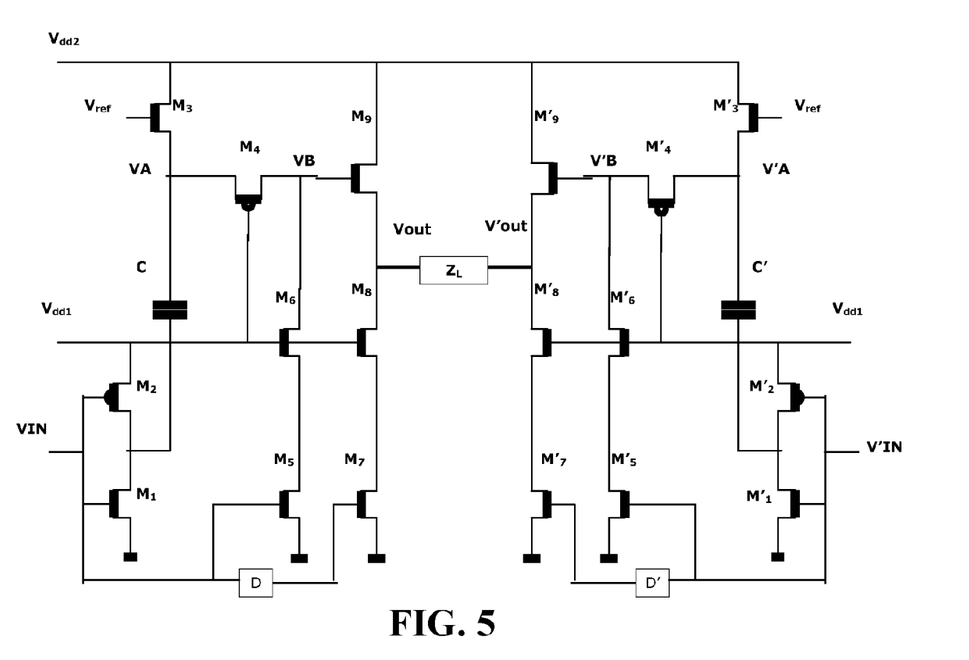
FIG. 5 is an embodiment of a differential CMOS driver architecture, according to the present invention.

FIGS. 4 and 5 show several embodiments of the single-ended and differential driver architectures, respectively. These architectures may be realized with any modern VLSI CMOS technology with the availability of dual gate oxide, and also with any modern BICMOS technology. The functioning of the driver architecture will be described while referring to the single-ended embodiment of FIG. 4, though the same considerations hold the same for the differential embodiment of FIG. 5.

An input inverter including the transistors M1-M2 (M'1-M'2) is driven by a CMOS compatible switching input signal VIN (V'IN). An integrated capacitor C (C') is pre-charged at a desired voltage equal to Vref-Vth, wherein Vth is the threshold voltage of the cascode stage M3 (M'3), during one semi-period of the input square waves. In this way, the working point of the cascode stage M3 (M'3) switches from a deep cutoff condition to a functioning condition close to the interdiction region, in order to restore the initial charge of the capacitor C. Whenever the output of the inverter is switched to the low voltage supply Vdd1, the switching network M4, M5 and M6 (M'4, M'5 and M'6) is configured to force at a voltage close to Vdd1+Vref-Vth the gate of the single high-voltage transistor M9 (M'9), that functions as an active load, thus causing a great overdrive to the transistor M9 (M'9). The class AB amplifier, comprising by the three transistors M9, M8 and M7 (M'9, M'8 and M'7), ensures an output peak voltage equal to:

$$V_{dd1}+V_{ref}-V_{th}-V_{gs}M_9;$$

wherein $V_{gs}M_9$ is the gate-source voltage on the transistor $M_9$.

The $V_{out}$ peak could also be programmable by adjusting the reference voltage $V_{ref}$. This last feature may be desirable also for calibration purposes. The high efficiency (class AB) and cross-conduction of the three output transistors are optimized by calibrating the delay D (D') according to the characteristics of the load in order to turn-on the transistors $M_7$ and $M_8$ (M'$_7$ and M'$_8$) only when $M_9$ (M'$_9$) has turned off. The two transistors $M_5$ (M'$_5$) and $M_6$ (M'$_6$) of the switching network are used to ensure a fast discharge of the gate-source capacitance of $M_9$ (M'$_9$).

Figure 6:
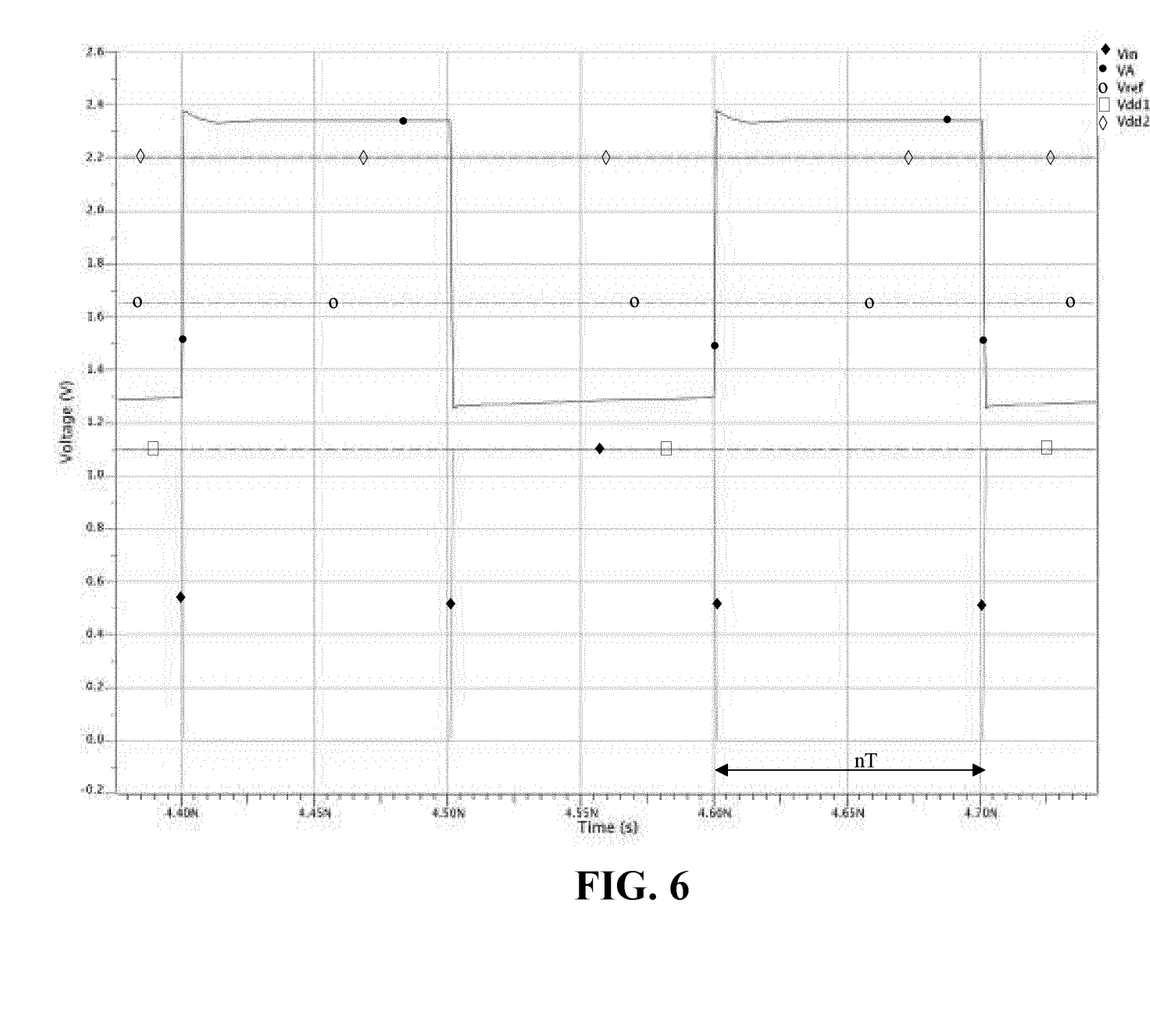
FIGS. 6 and 7 are graphs of the main signals of the CMOS driver architecture of FIG. 4.
Figure 7:
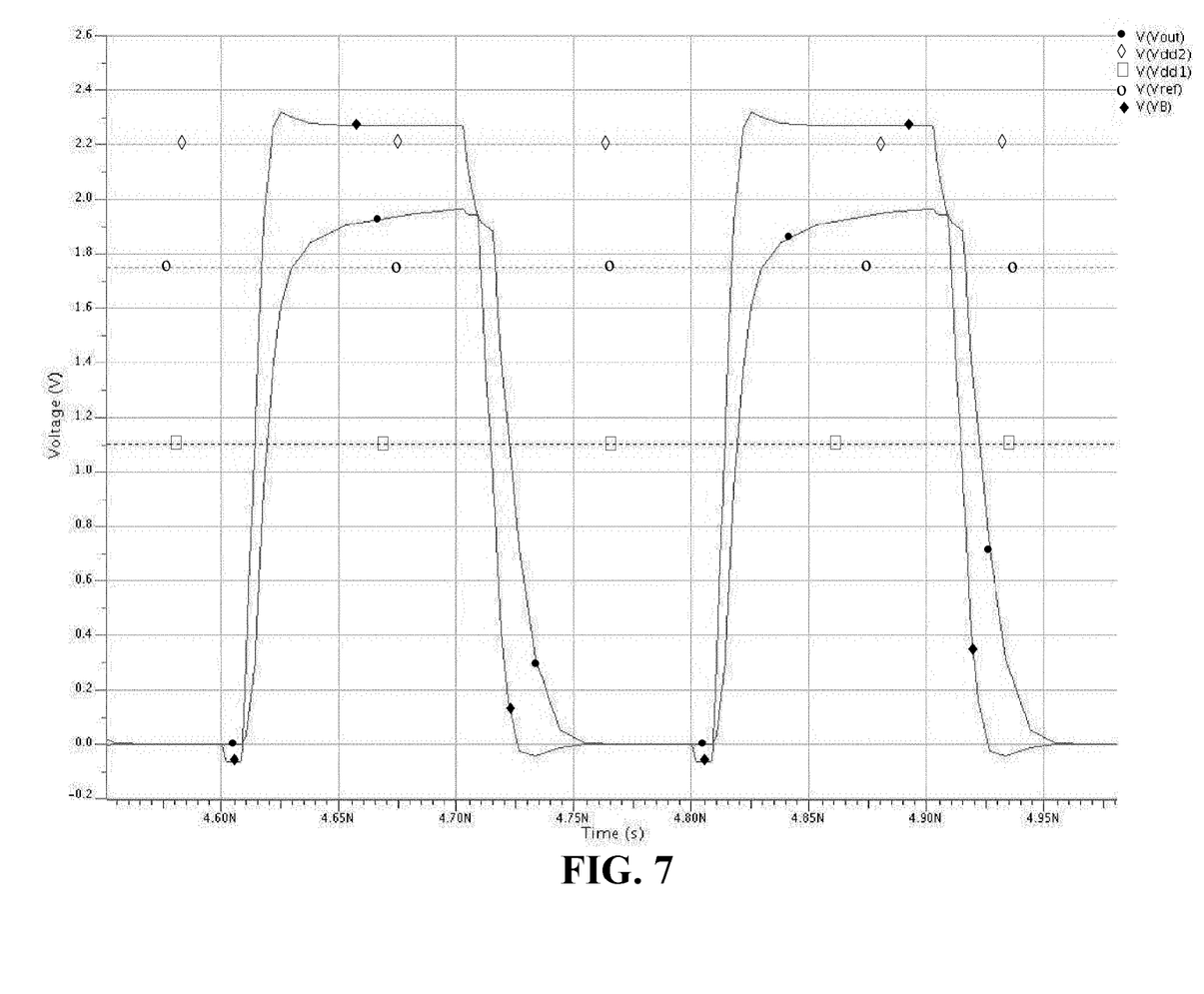

The time graphs of FIGS. 6 and 7 show exemplary waveforms when the input voltage $V_{in}$ (V'$_{in}$) switches between Vdd1 and ground. The shown exemplary pattern is made of positive and negative cycles whose duration is nT, wherein T is a known time unit interval, n assuming any integer value between 1 and N. The value of capacitors C (C') is preferably chosen proportionally to N and according to the output ripple that may be tolerated on the output voltage $V_{out}$ (V'$_{out}$).

When the input voltage $V_{IN}$ (V'$_{IN}$) switches low, the voltage $V_A$ (V'$_A$) switches high and the control terminal of the active load $M_9$ (M'$_9$) is disconnected from ground. Therefore, the switch $M_4$ (M'$_4$) turns on and the voltage $V_B$ (V'$_B$) equals the voltage $V_A$ (V'$_A$). After a certain time delay, determined by the delay D (D'), has elapsed, the transistor $M_7$ (M'$_7$) and thus also the transistor $M_8$ (M'$_8$) turn off. Accordingly, the output voltage $V_{out}$ (V'$_{out}$) on the supplied capacitive load increases and becomes practically equal to the voltage $V_B$ (V'$_B$), i.e. in practice, equal to the voltage $V_A$ (V'$_A$) (i.e. determined by the reference voltage $V_{ref}$(V'$_{ref}$). During this phase, the supplied capacitive load is charged through the transistor $M_9$ (M'$_9$), thus the rise time $t_r$ of the output voltage may be finely determined by fixing the resistance of the transistor $M_9$ (M'$_9$) in a conduction state.

When the input voltage $V_{IN}$ (V'$_{IN}$) switches high, the voltage $V_A$ (V'$_A$) switches low at a voltage slightly smaller than the reference voltage $V_{ref}$(V'$_{ref}$) in a time interval determined by the recovery time of the transistor $M_1$ (M'$_1$). Therefore, the transistors $M_5$ (M'$_5$) and $M_6$ (M'$_6$) of the switching network turn on, the control terminal of the active load $M_9$ (M'$_9$) is grounded and the transistor $M_4$ (M'$_4$) is off. After a certain time delay, determined by the delay D (D'), has elapsed, the transistor $M_7$ (M'$_7$) and thus also the transistor $M_8$ (M'$_8$) turn on, thus the output voltage $V_{out}$ on the supplied capacitive load decreases. During this phase, the supplied capacitive load is discharged through the transistors $M_8$ (M'$_8$) and $M_7$ (M'$_7$), thus the fall time $t_f$ of the output voltage may be finely determined by fixing the resistance in conduction state of these transistors.

The transistors may be sized to get the desired output peak current and the desired rise and fall time simply by adjusting the aspect ratio of the transistors $M_7$(M'$_7$) and $M_9$ (M'$_9$) and the delay D (D'). In order to limit the total in-out current capability, a series resistor R may be connected in series to the supplied load, as shown in FIG. 4.

The disclosed approach does not need any type of level shifter to adapt the low voltage input signal to the output buffer, furthermore it allows Vout peak programmability through a reference voltage $V_{ref}$, that may be easily controlled by a digital-to-analog converter. Moreover, the disclosed architectures have a low power consumption and a high power efficiency. The claims as filed are integral part of this description and are herein incorporated by reference.

The invention claimed is:

1. A driver circuit comprising:
   a first node;
   a first circuit configured to generate on said first node an inverted replica of an input signal between a first supply voltage and a first reference voltage, the inverted replica having a threshold voltage value based upon a second reference voltage greater than the first supply voltage;
   a cascode stage configured to be controlled by the second reference voltage and to be coupled between a second supply voltage and said first node;
   a delay circuit configured to generate a delayed replica of the input signal;
   an amplifier comprising
      a first switch configured to be coupled to the first reference voltage and to be controlled by the delayed replica of the input signal,
      a second switch configured to be controlled by the first supply voltage and comprising a conduction terminal to define an output terminal, and
      an active load switch configured to be coupled between the output terminal and the second supply voltage and comprising a control terminal; and
   a switching network configured to couple said control terminal of said active load switch to at least one of the first reference voltage and said first node based upon the input signal.

2. The driver circuit of claim 1 wherein the input signal comprises a square-wave input signal; and wherein said switching network is configured to couple said control terminal of said active load transistor to at least one of the first reference voltage and said first node based upon a level of the square-wave input signal.

3. The driver circuit of claim 1 wherein said first circuit comprises:
   a push-pull inverting stage configured to invert the input signal and to be coupled between the first supply voltage and the first reference voltage, and comprising a plurality of switches having a common node; and
   a boost capacitor configured to be coupled between said common node of said plurality of switches and said first node and to be charged at a voltage to keep said cascode stage in a functioning mode.

4. The driver circuit of claim 1 wherein said delay circuit is configured to generate a delay to turn on said first switch after said active load switch has turned off.

5. The driver circuit of claim 1 wherein said active load switch has a first conductivity type; and wherein said switching network comprises:
a first transistor having a second conductivity type, and configured to be controlled by the first supply voltage and to be coupled between said first node and said control terminal of said active load switch;
a second node;
a second transistor having the first conductivity type, and configured to be controlled by the input signal and to be coupled between said second node and the first reference voltage; and
a third transistor having the first conductivity type, and configured to be controlled by the first supply voltage and to be coupled between said second node and said control terminal of said active load switch.

6. The driver circuit of claim 1 wherein said first switch, and said second switch, each comprises a low-voltage metal-oxide-semiconductor field-effect transistor (MOSFET).

7. The driver circuit of claim 1 wherein said conduction terminal of said second switch is not in common with said first switch.

8. The driver circuit of claim 1 wherein said active load switch comprises a high-voltage active load switch.

9. The driver circuit of claim 1 wherein said amplifier comprises a class AB amplifier.

10. A differential driver circuit comprising:
a plurality of driver circuits configured to be input with respective complementary input signals and each driver circuit comprising
a first node,
a first circuit configured to generate on said first node an inverted replica of a respective complementary input signal between a first supply voltage and a first reference voltage, the inverted replica having a threshold voltage value based upon a second reference voltage greater than the first supply voltage,
a cascode stage configured to be controlled by the second reference voltage and to be coupled between a second supply voltage and said first node,
a delay circuit configured to generate a delayed replica of the respective complementary input signal,
an amplifier comprising
a first switch configured to be coupled to the first reference voltage and to be controlled by the delayed replica of the respective complementary input signal,
a second switch configured to be controlled by the first supply voltage and comprising a conduction terminal to define an output terminal, and
an active load switch configured to be coupled between the output terminal and the second supply voltage and comprising a control terminal, and
a switching network configured to couple said control terminal of said active load transistor to at least one of the first reference voltage and said first node based upon the respective complementary input signal.

11. The differential driver circuit of claim 10 wherein the respective complementary input signal comprises a square-wave input signal; and wherein said switching network is configured to couple said control terminal of said active load transistor to at least one of the first reference voltage and said first node based upon a level of the square-wave input signal.

12. The differential driver circuit of claim 10 wherein said first circuit comprises:
a push-pull inverting stage configured to invert the respective complementary input signal and to be coupled between the first supply voltage and the first reference voltage, and comprising a plurality of switches having a common node; and
a boost capacitor configured to be coupled between said common node of said plurality of switches and said first node and to be charged at a voltage to keep said cascode stage in a functioning mode.

13. The differential driver circuit of claim 10 wherein said delay circuit is configured to generate a delay to turn on said first switch after said active load switch has turned off.

14. The differential driver circuit of claim 10 wherein each driver circuit from said plurality thereof is identical.

15. A Mach-Zehnder optical modulator comprising:
a modulator; and
a driver configured to control the said modulator and comprising
a first node,
a first circuit configured to generate on said first node an inverted replica of an input signal between a first supply voltage and a first reference voltage, the inverted replica having a threshold voltage value based upon a second reference voltage greater than the first supply voltage,
a cascode stage configured to be controlled by the second reference voltage and to be coupled between a second supply voltage and said first node,
a delay circuit configured to generate a delayed replica of the input signal,
an amplifier comprising
a first switch configured to be coupled to the first reference voltage and to be controlled by the delayed replica of the input signal,
a second switch configured to be controlled by the first supply voltage and comprising a conduction terminal to define an output terminal, and
an active load switch configured to be coupled between the output terminal and the second supply voltage and comprising a control terminal, and
a switching network configured to couple said control terminal of said active load switch to at least one of the first reference voltage and said first node based upon the input signal.

16. The Mach-Zehnder optical modulator of claim 15 wherein the input signal comprises a square-wave input signal; and wherein said switching network is configured to couple said control terminal of said active load transistor to at least one of the first reference voltage and said first node based upon a level of the square-wave input signal.

17. The Mach-Zehnder optical modulator of claim 15 wherein said first circuit comprises:
a push-pull inverting stage configured to invert the input signal and to be coupled between the first supply voltage and the first reference voltage, and comprising a plurality of switches having a common node; and
a boost capacitor configured to be coupled between said common node of said plurality of switches and said first node and to be charged at a voltage to keep said cascode stage in a functioning mode.

18. The Mach-Zehnder optical modulator of claim 15 wherein said delay circuit is configured to generate a delay to turn on said first switch after said active load switch has turned off.

19. The Mach-Zehnder optical modulator of claim 15 wherein said active load switch has a first conductivity type; and wherein said switching network comprises:
- a first transistor having a second conductivity type, and configured to be controlled by the first supply voltage and to be coupled between said first node and said control terminal of said active load switch;
- a second node;
- a second transistor having the first conductivity type, and configured to be controlled by the input signal and to be coupled between said second node and the first reference voltage; and
- a third transistor having the first conductivity type, and configured to be controlled by the first supply voltage and to be coupled between said second node and said control terminal of said active load switch.

* * * * *